United States Patent
Western et al.

(10) Patent No.: US 10,361,321 B2
(45) Date of Patent: Jul. 23, 2019

(54) METHOD OF FORMING A CONTACT FOR A PHOTOVOLTAIC CELL

(71) Applicant: NewSouth Innovations Pty Ltd, Sydney, New South Wales (AU)

(72) Inventors: Ned Western, Sydney (AU); Stephen Bremner, Sydney (AU)

(73) Assignee: NewSouth Innovations Pty Ltd, Sydney, New South Wales (AU)

( * ) Notice: Subject to any disclaimer, the term of this patent is extended or adjusted under 35 U.S.C. 154(b) by 0 days.

(21) Appl. No.: 14/423,379

(22) PCT Filed: Aug. 16, 2013

(86) PCT No.: PCT/AU2013/000911
§ 371 (c)(1),
(2) Date: Feb. 23, 2015

(87) PCT Pub. No.: WO2014/028964
PCT Pub. Date: Feb. 27, 2014

(65) Prior Publication Data
US 2015/0303324 A1  Oct. 22, 2015

(30) Foreign Application Priority Data
Aug. 22, 2012 (AU) .............................. 2012903616

(51) Int. Cl.
*H01L 31/0224* (2006.01)
*H01L 31/068* (2012.01)
*H01L 31/18* (2006.01)

(52) U.S. Cl.
CPC .... *H01L 31/022425* (2013.01); *H01L 31/068* (2013.01); *H01L 31/18* (2013.01);
(Continued)

(58) Field of Classification Search
CPC ........... H01L 31/022525; H01L 31/068; H01L 31/06; H01L 31/18; H01L 31/188;
(Continued)

(56) References Cited

U.S. PATENT DOCUMENTS

| 5,538,564 A | 7/1996 | Kaschmitter |
| 2004/0025932 A1 | 2/2004 | Husher |

(Continued)

FOREIGN PATENT DOCUMENTS

| WO | WO 2012000687 A1 * | 1/2012 | ................ B26F 1/28 |

OTHER PUBLICATIONS

International Search Report for PCT/AU2013/000911 dated Nov. 5, 2013 (3 pages).

*Primary Examiner* — Devina Pillay
*Assistant Examiner* — Daniel P Malley, Jr.
(74) *Attorney, Agent, or Firm* — Michael Best & Friedrich LLP

(57) ABSTRACT

The present disclosure provides a method of forming a contact for a photovoltaic (PV) cell. The method comprises the step of providing a substrate of a semiconductor material. The substrate has first regions that have a first doping property and are located at first surface portions. The method also comprises depositing a passivation layer on the surface of the substrate including the first surface portions. Further, the method comprises depositing a conductive layer on the passivation layer such that material of the passivation layer is sandwiched between the first regions and the conductive layer. In addition, the method comprises applying an electric field between the first regions and the conductive layer in a manner such that locally a dielectric breakdown of the sandwiched passivation layer material is induced. The first regions having a doping property and the method is conducted such that an electrical resistance is reduced in the (Continued)

passivation layer at the first regions and an electrical contact is formed.

20 Claims, 4 Drawing Sheets

(52) U.S. Cl.
CPC ........ *H01L 31/1804* (2013.01); *Y02E 10/547* (2013.01); *Y02P 70/521* (2015.11)

(58) Field of Classification Search
CPC ......... H01L 31/0224; H01L 31/022408; H01L 31/022425; H01L 31/022441; H01L 31/022458; Y02E 10/50; Y02E 10/54; Y02E 10/547
See application file for complete search history.

(56) References Cited

U.S. PATENT DOCUMENTS

| | | | | |
|---|---|---|---|---|
| 2005/0172996 A1* | 8/2005 | Hacke | ............. | H01L 31/022433 136/256 |
| 2008/0179547 A1* | 7/2008 | Henley | ............. | H01L 21/76254 250/492.21 |
| 2009/0142874 A1* | 6/2009 | Arai | ................... | H01L 31/02168 438/57 |
| 2009/0227061 A1* | 9/2009 | Bateman | ............. | H01L 31/1804 438/57 |
| 2010/0275982 A1* | 11/2010 | Abbott | ................ | H01L 31/0352 136/255 |
| 2011/0086468 A1* | 4/2011 | Felk | ........................ | H01L 24/08 438/109 |
| 2013/0213467 A1* | 8/2013 | Nattermann | ............. | B26F 1/28 136/256 |

* cited by examiner

METHOD OF FORMING A CONTACT FOR A PHOTOVOLTAIC CELL

FIELD OF THE INVENTION

The present invention relates to a method of forming a contact for a photovoltaic (PV) cell and relates in particular, not exclusively though, to a method of forming a contact on a rear surface of the PV cell.

BACKGROUND OF THE INVENTION

Typical PV cells of the first generation comprise large area p-n-junctions that are formed in doped silicon. Such PV cells have a passivation layer on a rear surface and electrical contacts penetrate through the passivation layer to contact selected highly doped regions of the silicon.

The alignment of the contacts relative to the selected highly doped regions of the silicon and electrical properties of the contact material influence the efficiency of the solar cell and there is a need for improvement.

SUMMARY OF THE INVENTION

In a first aspect of the invention, there is provided a method of forming a contact for a photovoltaic (PV) cell, the method comprising the steps of:
  providing a substrate of a semiconductor material, the substrate having at least one first region that has a first doping property and is located at a first surface portion;
  depositing a passivation layer over at least a portion of the surface of the substrate including the at least one first surface portion;
  depositing a conductive layer over the passivation layer such that material of the passivation layer is sandwiched between the at least one first region of the substrate and the conductive layer; and
  applying an electric field between the at least one first region and the conductive layer in a manner such that locally a dielectric breakdown of the sandwiched passivation layer material is induced;
  wherein the method is conducted such that an electrical resistance is reduced in the passivation layer at the at least one first region and an electrical contact is formed.

In one specific embodiment, the substrate comprises at least one second region that is adjacent the at least one first region and my at least in part surround the at least one first region. The at least one first region may have a doping property that is different to that of the at least one first region. The at least one first region and the at least one second region may have the same polarity. Alternatively, the at least one second region may have a p-n junction and the at least one first region may penetrate through the p-n junction.

The method typically is conducted such the electrical breakdown is only induced between the at least one first region and the conductive layer and not between the at least one second region and the conductive layer. The method typically is conducted such that the passivation properties of the passivation layer material that is adjacent the formed contact are substantially unaffected.

Embodiments of the invention have significant advantages. As the dielectric breakdown is induced only at the locations of the at least one first region, the contact is effectively self-aligned.

The method typically is conducted such that a plurality of contacts is formed.

Further, the method typically is conducted such that the contact is formed on a rear surface of the PV cell.

In one embodiment, the doping property is a doping concentration. Alternatively, the doping property may be a type of doping material.

In a specific embodiment, the at least one first region has a higher doping concentration than the at least one second region. For example, the at least one first region may be doped with boron or any other suitable dopant material. The dopant concentration of the at least one first region may range from $1e18/cm^3$ to $1e21/cm^3$, such as approximately $1e20/cm^3$. The at least one second region may also be doped with boron or with any other suitable dopant material. The dopant concentration of the at least one second region may range from $1e15/cm^3$ to $1e17/cm^3$, such as approximately $1e16/cm^3$.

In one embodiment, the step of providing the substrate comprises forming the at least one first region. Forming the at least one first region may comprise thermal diffusion. In one specific example forming the at least one first region comprises laser doping.

Forming the at least one first region may comprise depositing a layer that functions as a dopant source for the at least one first surface portion. The layer may include the dopant material, such as boron or any other suitable material. The layer may be formed by spin-on deposition. In addition, forming the at least one first region may comprise directing a laser beam selectively towards the at least one first surface portion such that the dopant material diffuses into the substrate and thereby forms the at least one first region.

The method may further comprise removing the layer that functions as a dopant source when the at least one first region has been formed. Removing the layer may comprise rinsing, RCA cleaning and/or selective etching.

In one specific embodiment the substrate is a p-type substrate, such as a p-type silicon wafer. In addition, the substrate may be selectively doped in the above-described manner and consequently the at least one first region may have a higher p-dopant concentration than some or all of the remaining regions of the substrate.

Alternatively, the substrate may also be an n-type substrate and the at least one first region may have a concentration of an n-type dopant that is higher than that of some or all of the remaining regions of the substrate.

In one embodiment, the step of depositing the passivation layer onto the at least a portion of the substrate is conducted by virtue of chemical vapour deposition, such as plasma-enhanced chemical vapour deposition.

The passivation layer may comprise amorphous silicon or any other suitable dielectric material.

The step of depositing the conductive layer over the passivation layer may be conducted using thermal evaporation. Alternatively, the conductive layer may be deposited over the passivation layer using sputtering or any other physical or chemical deposition technique.

The material of the conductive layer may be selected based on the doping property of the at least one first region. For example, if the at least one first region is p-doped, the material of the conductive layer may be selected from suitable acceptor materials and may, for example, be aluminium.

Alternatively, if the at least one first region is n-doped, the material of the conductive layer may be selected from suitable donor materials, such as arsenic.

The method may further comprise a step of removing at least a portion of the conductive layer.

In a second aspect of the invention, there is provided a method of forming a photovoltaic cell comprising forming a contact in accordance with the first aspect of the present invention.

In a third aspect of the present invention there is provided a photovoltaic cell formed by the method in accordance with the second aspect of the present invention.

BRIEF DESCRIPTION OF THE DRAWINGS

In order to fully understand the present invention, embodiments of the present invention will now be described, by way of example only, with reference to the accompanying drawings, in which.

DESCRIPTION OF AN EMBODIMENT OF THE INVENTION

Referring to the Figures, there is illustrated a method 10 of forming a contact for a photovoltaic (PV) cell in accordance with a specific embodiment of the invention. In this embodiment, the contact is formed on a rear surface of the PV cell that will not receive primary illumination. In this embodiment, the PV cell comprises suitably doped silicon.

Figure 1:
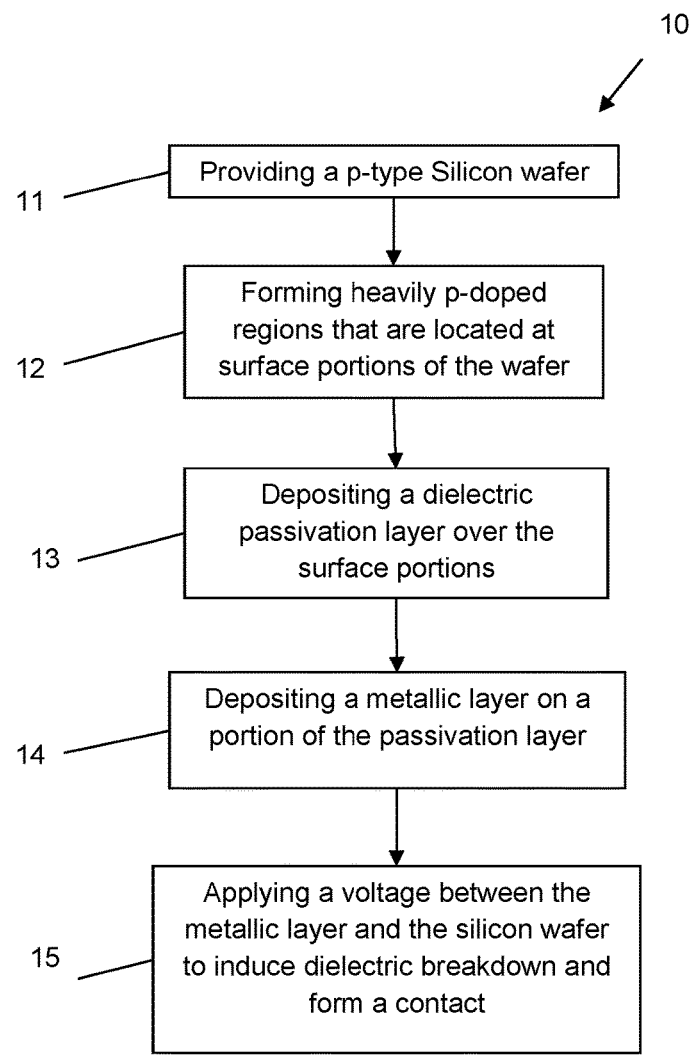
FIG. 1 is a flow diagram illustrating a method of forming a contact for a photovoltaic cell in accordance with an embodiment of the invention.
Figure 2:
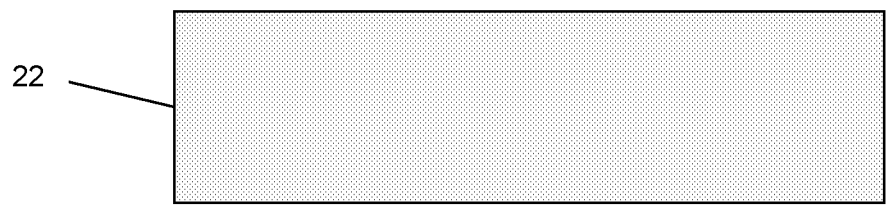
FIGS. 2 to 7 illustrate the formation of components of the photovoltaic cell formed in accordance with embodiments of the present invention.
Figure 3:
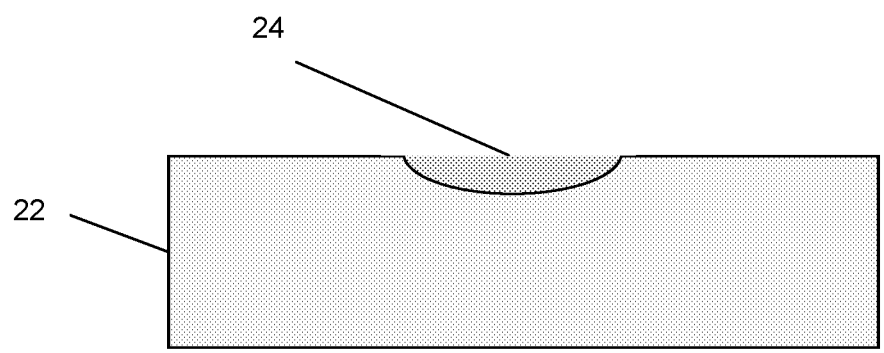
Figure 4:
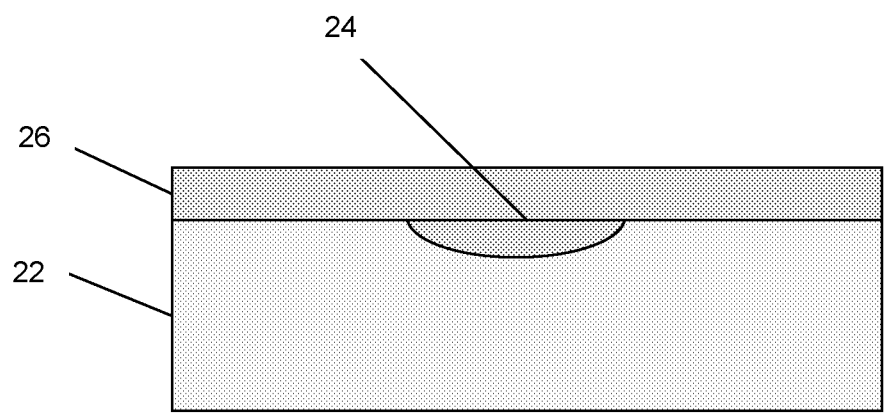
Figure 5:
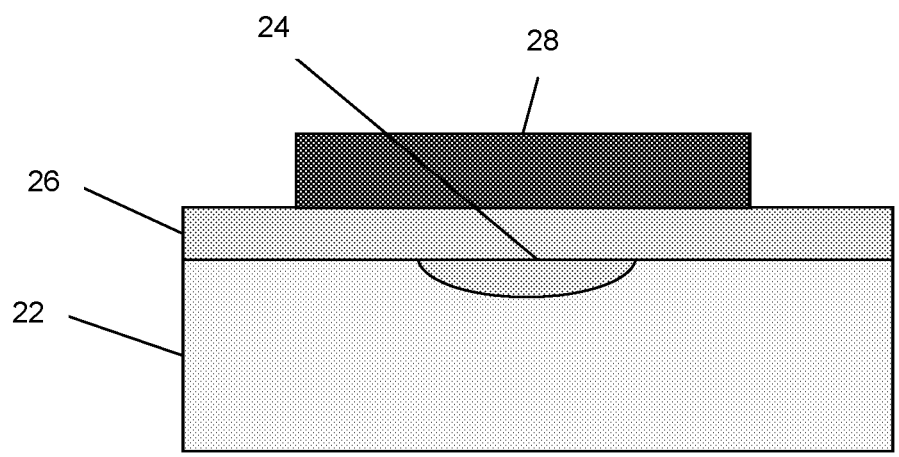

FIG. 1 shows a flow diagram illustrating a method 10 of forming a contact on a rear surface of the PV cell. FIGS. 2 to 7 illustrate the formation of the PV cell and show partially fabricated components.

In a first step 11, a substrate 22 is provided. In this embodiment, the substrate 22 is a p-type silicon wafer. The doping concentration of the p-type Silicon wafer is approximately 1e16/cm$^3$.

The PV cell further comprises a layer (not shown) on a front surface portion of the substrate 22 which receives primary (solar) illumination when the PV cell is in use. Together with the substrate 22, this layer, which may for example be a thin n-type layer, is arranged to form a p-n junction.

In a further step 12, a plurality of first regions 24 is formed within the substrate 22 (only one first region is shown in FIGS. 2 to 7). The first regions 24 are located at respective first (rear) surface portions of the substrate 22 as exemplarily shown in FIG. 3. The first regions are in the form of islands.

The first regions 24 have a doping concentration that differs from that of adjacent regions of the p-type silicon wafer 22. In this embodiment the first regions are heavily p-doped and have p-doping concentration that is higher than that of adjacent regions of the p-type silicon wafer 22. In this example, the heavily p-doped region 24 has a p-doping concentration of approximately 1e20/cm$^3$.

A person skilled in the art will appreciate that in variations of the described embodiment the first region may also have a doping property other that a doping concentration that is different to that of adjacent regions. For example, the doping property may be associated with a dopant type or material.

The heavily p-doped regions 24 may be formed using any suitable method and in this example these regions are formed using laser doping. Forming the heavily p-doped regions 24 comprises depositing a material that functions as a dopant source onto the surface portions of the heavily p-doped regions 24. In this example, a spin on liquid containing boron is deposited on the rear surface portions of the p-type silicon wafer 22. A laser beam is then directed onto the formed film in a manner such that boron diffuses selectively into the silicon wafer 22 to form the heavily p-doped region 24. The film is subsequently removed from the surface portions of the substrate 22, for example, by rinsing or RCA cleaning.

Step 13 deposits a passivation layer 26 over the rear surface portions of the silicon wafer 22. In this example, the passivation layer 26 is an amorphous silicon layer and has a thickness in the range of 30 to 120 nm, in particular in the range of 50 to 70 nm, such as approximately 50 nm.

Step 14 deposits a conductive layer 28 on the amorphous silicon layer 26. In this particular embodiment, the conductive layer 28 is an aluminium layer. The aluminium layer 28 is deposited by virtue of thermal evaporation. However, a person skilled in the art will appreciate that other suitable methods to deposit the conductive layer are envisaged, such as sputtering. Further, the conductive layer may not necessarily be formed form a metallic material.

Figure 6:
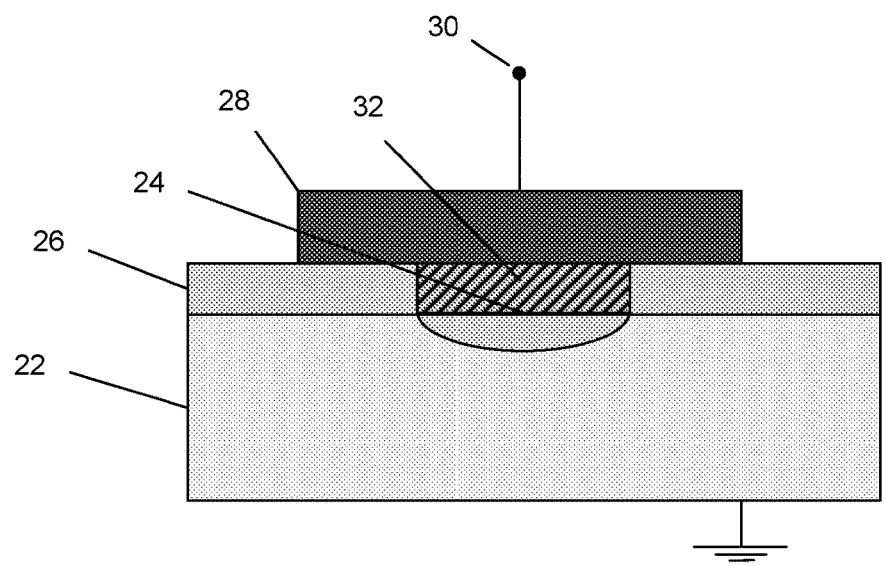

Step 15 applies an electric field between the aluminium layer 28 and the silicon wafer 22. As such, a voltage 30 is applied in reverse bias. In this example the substrate 22 is p-type and a positive voltage 30 is applied to the aluminium layer 28 as illustrated in FIG. 6. In an alternative embodiment, in which the substrate comprises an n-type material, a negative voltage is applied to the conductive layer.

By applying the voltage 30 in reverse bias, an electric field is generated across the passivation layer 26 between the aluminium layer 28 and the p-type silicon substrate 22. The strength of the generated electric field is higher across the region 32 that is located directly above the heavily p-doped region 24 than across adjacent regions of passivation layer. In this embodiment the heavily p-doped region 24 forms a depletion region that is narrow enough for tunnelling to occur. Consequently, the electrical field is mainly applied across the passivation layer 26 at the first regions 24. The passivation layer 26 is sufficiently thin such that the relatively large applied field results in a breakdown of dielectric properties and a related permanent local reduction of electrical resistance of the passivation layer 26 in the region 32. The dielectric breakdown is a "hard" breakdown such that the amorphous silicon layer 26 locally loses its insulating properties. The permanent change in local electrical properties of the regions 32 results in the formation of an electrical contact.

The hard dielectric breakdown is limited to the local regions 32 directly at the heavily p-doped regions 24. Regions of the passivation layer 26 that are adjacent to region 32 are not significantly affected by the applied voltage 30 and as a consequence these regions maintain the passivation properties of amorphous silicon.

The bias voltage required to induce the hard breakdown of the dielectric material 26 generally depends on material properties of the heavily p-doped regions 24 and the dielectric material 26. The bias voltage typically is in the range of 5 to 30V, such as approximately 10V. Generally, the bias voltage increases with the resistivity of the dielectric material 26. The bias voltage is affected by thickness of the dielectric material 26 and increases when the thickness of the dielectric material 26 increases.

The inventors have found that the bias voltage required to induce the hard breakdown of a 64 nm thick amorphous silicon layer is in the range 2 to 5V; a 10 nm thick aluminium oxide layer is in the range of 5 to 10V; an 80 nm thick silicon rich silicon nitride layer is in the range 13 to 18V and a 200 nm silicon nitride layer is in the range of 23 to 28V.

By conducting the method 10 in accordance with the specific embodiment of the invention, a self-aligned electrical contact is formed without the requirement of patterning or masking the amorphous silicon layer 26. Furthermore, as dielectric properties of regions adjacent to the regions 32 of the passivation layer 26 are not significantly affected, recombination of charge carriers at the rear surface of the PV cell can be reduced.

Figure 7:
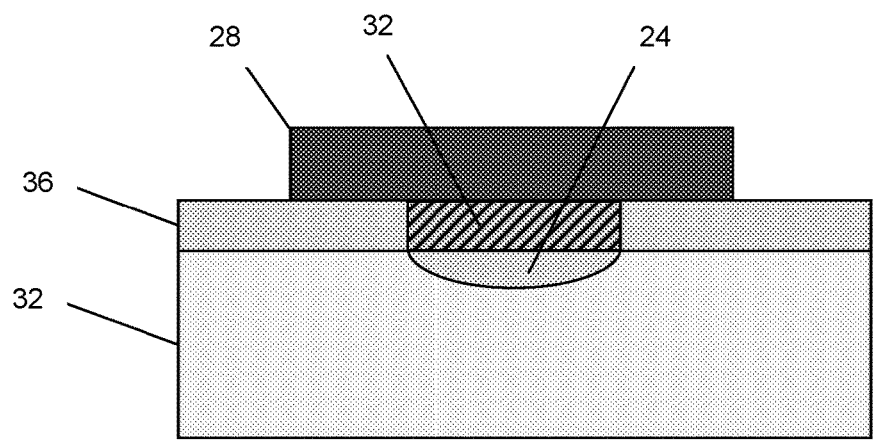

In this particular example, the aluminium layer 28 forms a portion of the rear contact of the PV cell as shown in FIG. 7.

The method 10 may further comprise a step of removing the aluminium layer 28.

Advantageous embodiments of the method 10 can be used to form contacts to the base of a PV device through an emitter of a PV device. In these specific embodiments the steps of method 10 are carried out on a semiconductor substrate, for example a silicon wafer, which comprises a p-n junction. The semiconductor substrate may be a p-type silicon wafer 11 (base) and an n-type region (emitter) may be formed on a surface of the p-type silicon wafer 11 by diffusion of n-type atoms, for example phosphorous atoms. The remaining steps of method 10 are performed on the n-type surface of the silicon wafer 11. Some of the advantages of contacting the base of the PV device through the emitter of the PV device by using the method 10 include floating junction passivation, implementation of inter-digitated rear contact designs, and minimisation of shunts.

A person skilled in the art will appreciate that the embodiments of the invention described in relation to a PV device realised on a p-type substrate are applicable to PV devices realised on n-type substrates. Further, the person skilled in the art will appreciate that, in order to realise a complete and functioning, PV device additional processing steps are required. These further processing steps are known in the art.

Modifications and variations as would be apparent to a skilled addressee are deemed to be within the scope of the present invention. For example, a person skilled in the art will appreciate that the substrate 22 may be an n type wafer and the at least one first region may be a heavily n-doped region. Further, the variations of the described method may be used to form selective contacts at a front surface of a PV cell.

The invention claimed is:

1. A method of forming a contact for a photovoltaic (PV) cell, the method comprising the steps of:
   providing a substrate of a semiconductor material, the substrate having a plurality of first regions that have a first doping concentration and a plurality of second regions that are adjacent the first regions and have a second doping concentration that is lower to that of the first regions, the first regions and the second regions having the same polarity and being located at a surface portion of the substrate, wherein an interface is formed between each first region and adjacent second region;
   depositing a passivation layer over the surface portion;
   forming a patterned conductive layer comprising a plurality of conductive regions over the passivation layer such that material of the passivation layer is in contact with the substrate and the conductive regions of the conductive layer; each conductive region completely covering at least one of the first regions and being wider than the at least one of the first regions; and
   applying a bias voltage between the substrate and the conductive layer, the substrate having the plurality of first regions and the plurality of second regions that are adjacent the first regions, whereby an electric field is induced resulting in a dielectric breakdown of self-alignable portions of the passivation layer material in direct contact with the one or more of the first regions and the respective conductive regions while dielectric properties of the passivation layer material in contact with the second regions and the respective conductive regions are preserved, wherein each self-alignable portion has a boundary substantially aligned with the interface between a respective first region and adjacent second region;
   wherein the method is conducted such that portions of reduced electrical resistance are selectively formed in the passivation layer to facilitate current flow between first regions and respective portions of the conductive layer regardless of alignment precision between the first regions and the respective portions of the conductive layer.

2. The method of claim 1 wherein the method is conducted such that the passivation properties of passivation layer material that is adjacent the portions of reduced electrical resistance are substantially unaffected.

3. The method of claim 1 being conducted such that selective electrical contacts are formed on a rear surface of the PV cell.

4. The method of claim 1 wherein the step of providing the substrate comprises forming the first regions.

5. The method of claim 4 wherein the first regions are formed using thermal diffusion.

6. The method of claim 5 wherein the first regions are formed using laser doping.

7. The method of claim 6 wherein forming the first regions comprises:
   depositing a layer that functions as a dopant source for the at least one first surface portion; and
   directing a laser beam selectively towards the first surface portion such that the dopant material diffuses into the substrate and thereby forms the first regions.

8. The method of claim 1 wherein the passivation layer comprises amorphous silicon.

9. The method of claim 1 wherein the material of the conductive layer is selected based on the doping concentration of the first regions.

10. A method of forming a photovoltaic cell comprising forming a contact for a PV cell using a method in accordance with claim 1.

11. A photovoltaic cell formed by the method of claim 10.

12. A method of forming a contact for a photovoltaic (PV) cell, the method comprising the steps of:
   (a) providing a substrate of a semiconductor material;
   (b) forming a plurality of first regions in the semiconductor material, wherein:
      (i) each first region is adjacent a second region of the semiconductor material such that an interface is formed between each first region and adjacent second region;
      (ii) each first region has a higher doping concentration than each second region; and
      (iii) the first regions and the second regions have the same polarity and are located at a surface portion of the substrate;
   (c) depositing a passivation layer over the surface portion such that a first side of the passivation layer is in contact with each first region and adjacent second region;
   (d) forming, on a second side of the passivation layer opposite the first side, a patterned conductive layer comprising a plurality of conductive regions, such that:

(iv) each conductive region completely covers at least one of the first regions and is wider than the at least one of the first regions; and (v) the passivation layer is in contact with the substrate and the conductive regions of the conductive layer; and applying a bias voltage between the substrate and the conductive layer, the substrate having the plurality of first regions and the plurality of second regions that are adjacent the first regions, whereby an electric field is induced between one or more of the first regions and respective conductive regions, and causes a dielectric breakdown of self-alignable portions of the passivation layer in direct contact with one of the first regions and respective conductive regions, such that:

(vi) each self-alignable portion has a boundary substantially aligned with the interface between a respective one of the first regions and adjacent second region, (vii) dielectric properties of portions of the passivation layer in contact with the second regions and the respective conductive regions, other than the self-alignable portions, are preserved or substantially unaffected;

such that the self-alignable portions are portions of reduced electrical resistance selectively formed in the passivation layer to facilitate current flow between first regions and respective portions of the conductive layer regardless of alignment precision between the first regions and the respective portions of the conductive layer.

13. The method of claim 12, being conducted such that selective electrical contacts are formed on a rear surface of the PV cell.

14. The method of claim 12, wherein the first regions are formed using thermal diffusion.

15. The method of claim 12, wherein the first regions are formed using laser doping.

16. The method of claim 12, wherein forming the first regions comprises:
depositing a layer that functions as a dopant source for the at least one first surface portion; and
directing a laser beam selectively towards the first surface portion such that the dopant material diffuses into the substrate and thereby forms the first regions.

17. The method of claim 12, wherein the passivation layer comprises amorphous silicon.

18. The method of claim 12, wherein the material of the conductive layer is selected based on the doping concentration of the first regions.

19. A method of forming a photovoltaic cell comprising forming a contact for a PV cell using a method in accordance with claim 12.

20. A photovoltaic cell formed by the method of claim 19.

* * * * *